US011907044B2

(12) United States Patent
Otterstedt et al.

(10) Patent No.: US 11,907,044 B2
(45) Date of Patent: Feb. 20, 2024

(54) MEMORY DEVICES AND METHODS FOR OPERATING THE SAME

(71) Applicant: Infineon Technologies AG, Neubiberg (DE)

(72) Inventors: Jan Otterstedt, Unterhaching (DE); Wolf Allers, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/473,905

(22) Filed: Sep. 13, 2021

(65) Prior Publication Data

US 2022/0091914 A1    Mar. 24, 2022

(30) Foreign Application Priority Data

Sep. 22, 2020    (DE) .................... 102020211842.6

(51) Int. Cl.
*G06F 11/00* (2006.01)
*G11C 7/06* (2006.01)
*G06F 11/10* (2006.01)
*G06F 3/06* (2006.01)

(52) U.S. Cl.
CPC .......... *G06F 11/004* (2013.01); *G06F 3/0619* (2013.01); *G06F 3/0634* (2013.01); *G06F 3/0659* (2013.01); *G06F 3/0673* (2013.01); *G06F 11/1076* (2013.01); *G11C 7/06* (2013.01)

(58) Field of Classification Search
CPC .... G06F 11/004; G06F 3/0619; G06F 3/0634; G06F 3/0659; G06F 3/0673; G06F 11/1076; G11C 7/06
See application file for complete search history.

(56) References Cited

U.S. PATENT DOCUMENTS

| 9,202,531 | B2 * | 12/2015 | Seo .................. G11C 7/065 |
| 2004/0047197 | A1 * | 3/2004 | Jeon ................ G11C 11/404 365/200 |
| 2010/0281340 | A1 | 11/2010 | Franceschini et al. |

(Continued)

FOREIGN PATENT DOCUMENTS

| DE | 102009051109 A1 | 5/2010 |
| DE | 102016115177 A1 * | 2/2018 |
| DE | 102018132503 A1 | 6/2020 |

*Primary Examiner* — Albert Decady
*Assistant Examiner* — Enamul M Kabir
(74) *Attorney, Agent, or Firm* — COOPER LEGAL GROUP, LLC

(57) ABSTRACT

A memory device comprises a plurality of memory cells and a plurality of evaluation elements, wherein each evaluation element of the plurality of evaluation elements is connectable with a memory cell of the memory device. The memory device further comprises an interconnection unit configured for connecting the plurality of memory cells to a first assignment of evaluation elements in a first state and for connecting the same plurality of memory cells to a second assignment of the evaluation elements in a second state. The memory device comprises an evaluation unit configured for controlling the interconnection unit to transition from the first state to the second state. The evaluation unit is configured for evaluating the plurality of memory cells in the first state to obtain a first evaluation result, and for evaluating the plurality of memory cells in the second state to obtain a second evaluation result.

21 Claims, 8 Drawing Sheets

(56) References Cited

U.S. PATENT DOCUMENTS

2017/0271031 A1\* 9/2017 Sharon .................. G11C 29/52
2018/0033495 A1    2/2018 Ghosh et al.
2021/0148886 A1\* 5/2021 Maney, Jr. ........... C12Q 1/6869

\* cited by examiner

MEMORY DEVICES AND METHODS FOR OPERATING THE SAME

RELATED APPLICATION

This application claims priority to German Patent Application No. 102020211842.6, filed on Sep. 22, 2020, entitled "MEMORY DEVICES AND METHODS FOR OPERATING THE SAME", which is incorporated by reference herein in its entirety.

SUMMARY

The present disclosure relates to memory devices, to methods for operating the same and to computer programs implementing such methods. The present disclosure, for example, relates to sense amplifier re-ordering for memory re-Read.

Memory devices may comprise a plurality of memory cells. Memory cells may be evaluated by evaluation elements. Example memory cells include transistors, resistive cells or the like. Such cells may be written or programmed and may be read.

Reading a memory cell may comprise evaluation of a physical parameter of the cell, e.g., a voltage or potential detectable at the cell, a current that is flowing through a cell and/or an electrical resistance that may be measured.

There is a need for reliably operating memory devices.

According to an example, a memory device comprises a plurality of memory cells and a plurality of evaluation elements, wherein each evaluation element of the plurality of evaluation elements is connectable with a memory cell of the memory device. The memory device comprises an interconnection unit configured for connecting the plurality of memory cells to a first assignment of evaluation elements in a first state, and for connecting the same plurality of memory cells to at least a second assignment of the evaluation elements in a second state. In the second state, at least one memory cell of the plurality of memory cells is connected to a different evaluation element to which the at least one memory cell is not connected in the first state. The memory device further comprises an evaluation unit configured for controlling the interconnection unit to transition from the first state to the second state. The evaluation unit is configured for evaluating the plurality of memory cells in the first state to obtain a first evaluation result and for evaluating the plurality of memory cells in the second state to obtain a second evaluation result.

According to an example, a memory device comprises a plurality of memory cells and a plurality of evaluation elements, wherein each evaluation element of the plurality of evaluation elements is connectable with a memory cell of the memory device. The memory device comprises an interconnection unit configured for connecting the plurality of memory cells to a first assignment of evaluation elements in a first state and for connecting the same plurality of memory cells to a second assignment of the evaluation elements in a second state. In the second state, at least one memory cell of the plurality of memory cells is connected to a different evaluation element to which the at least one memory cell is not connected in the first state. The device further comprises an evaluation unit configured for controlling the interconnection unit to transition from the first state to the second state. The device further comprises a memory having stored thereon error information indicating that a read operation using a pair (e.g., a specific pair) of a memory cell of the plurality of memory cells and an evaluation unit in the first state is error-prone. The evaluation unit is configured for reading the error information from the memory and for obtaining an evaluation result of the plurality of memory cells based on a reading operation performed using the second state based on the error information (e.g., the reading operation may be performed using the second state based on the error information).

According to an example, a memory device comprises a memory cell and a plurality of evaluation elements, wherein each evaluation element of the plurality of evaluation elements is connectable with the memory cell of the memory device. The memory device comprises an interconnection unit configured for connecting the memory cell to a first evaluation element in a first state and for connecting the memory cell to a second evaluation element in a second state. The memory device comprises an evaluation unit configured for obtaining a first evaluation result of the memory cell in the first state and for obtaining a second evaluation result of the memory cell in a second state. The evaluation unit is configured for determining a deviation between the first evaluation result and the second evaluation result, and for storing a deviation information in a memory of the memory device.

Further examples relate to methods for operating a memory device and to a computer program.

Further examples are defined in the dependent claims.

DESCRIPTION OF THE DRAWINGS

Examples will now be described, in the following, whilst making reference to the accompanying figures in which:

FIG. 6b shows an example second state of the configuration of FIG. 6a;

DETAILED DESCRIPTION

Figure 1B:
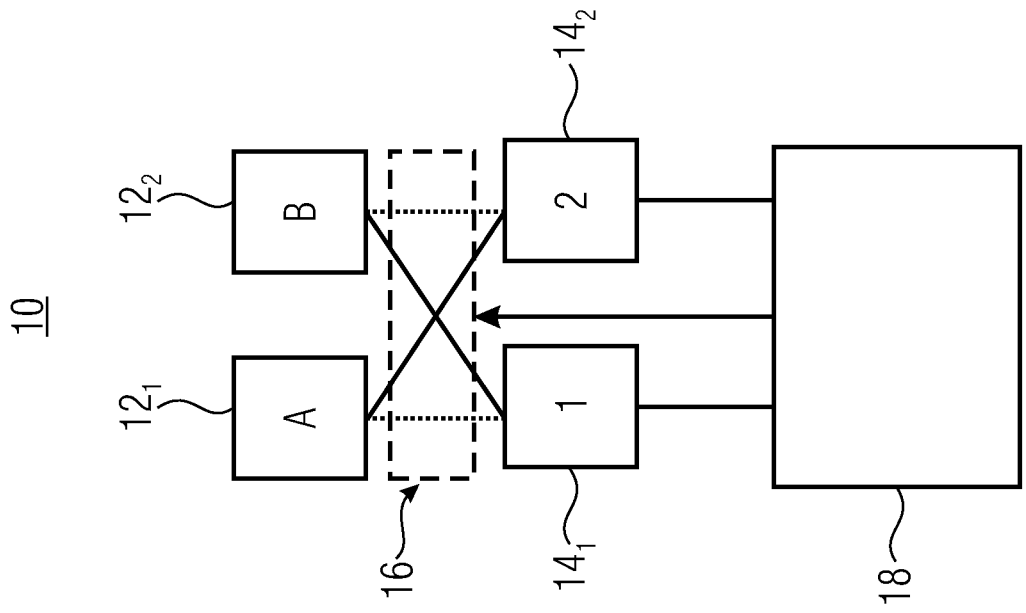
FIG. 1b shows a schematic block diagram of the memory device of FIG. 1a in a second state.

Equal or equivalent elements or elements with equal or equivalent functionality are denoted in the following description by equal or equivalent reference numerals even if occurring in different figures.

In the following description, a plurality of details is set forth to provide a more thorough explanation of embodiments of the present disclosure. However, it will be apparent to those skilled in the art that embodiments of the present disclosure may be practiced without these specific details. In other instances, well known structures and devices are shown in block diagram form rather than in detail in order to avoid obscuring embodiments of the present disclosure. In addition, features of the different embodiments described hereinafter may be combined with each other, unless specifically noted otherwise.

Examples described herein relate to memory devices that comprise memory cells which may be programmed and/or read. For example, examples described herein may relate to non-volatile memories such as EEPROM (electrically erasable programmable read-only memory), a Flash-memory, RRAM (resistive random access memory), PCRAM (phase change random access memory), FeRAM (ferroelectric random access memory), MRAM (magnetoresistive random access memory), CBRAM (conductive bridging random access memory) or the like, but are not limited hereto. Examples relate to evaluating programmable memory cells which is also applicable, without any limitation, to volatile memories like SRAM (static random access memory) and/or DRAM (dynamic random access memory).

Examples described herein relate to improving the reliability of memory devices, for example, semiconductor memory devices by providing for a robust read operation.

Examples relate to evaluation elements which may evaluate such memory cells. An evaluation element may be considered as an element that provides a result for a measurement value related to the memory cell it evaluates, e.g., an analog value. Such a value may, for example, be a current value, a voltage value and/or a resistance value.

A result of the evaluation unit may be further evaluated, e.g., quantized, to have a specific meaning. For example, the value obtained from the evaluation unit may be considered to be a logical 0 or a logical 1, wherein the assignments of evaluated values to logical meanings are possible, without any limitation.

Figure 1A:
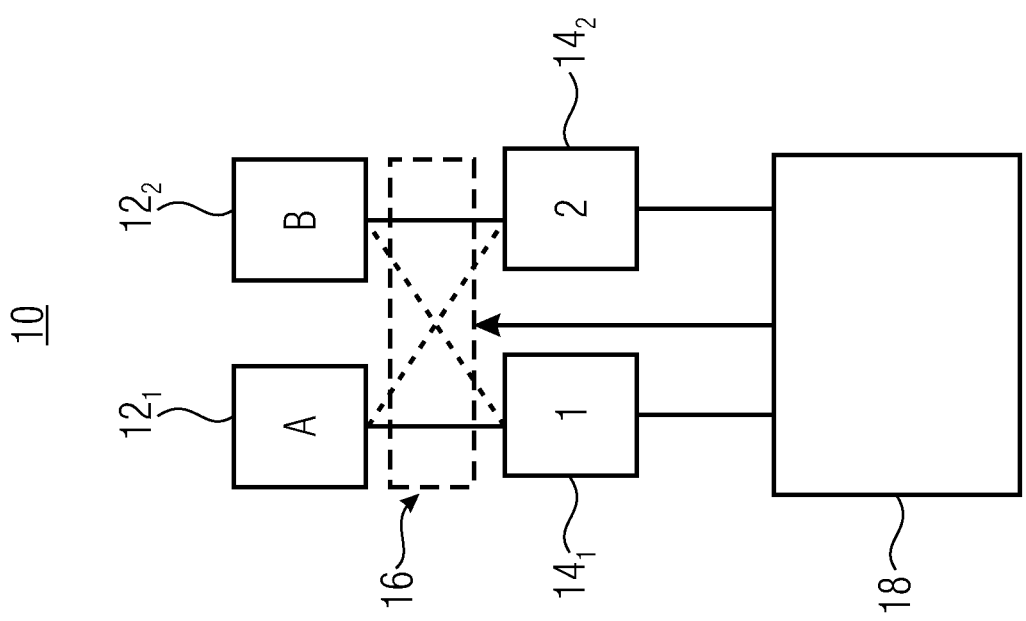
FIG. 1a shows a schematic block diagram of a memory device according to an example and in a first state.

FIG. 1a shows a schematic block diagram of a memory device 10 according to an example. The memory device 10 comprises a plurality of memory cells $12_1$ and $12_2$, wherein a number of memory cells may be larger than 2, e.g. at least 3, at least 5, at least 10, at least 100 or even one or more thousands (e.g., several thousands).

The memory device 10 further comprises a plurality of evaluation elements $14_1$ and $14_2$, wherein a number of evaluation elements may be larger than 2, e.g., at least 3, at least 5, at least 8, at least 16, at least 32 or any other number. In examples, a number of evaluation elements being implemented is lower than a number of memory cells to be evaluated with the evaluation elements 14. For example, the evaluation elements or a subset thereof may be connected to memory cells to be read in one operation and may be connected to different memory cells for different read operations. Each evaluation element $14_1$ and/or $14_2$ is connectable with a memory cell $12_1$ and/or $12_2$ of the memory cells.

The memory device 10 comprises an interconnection unit 16. As will be described in connection with FIG. 1b, the interconnection unit 16 is configured for connecting the memory cells $12_1$ and $12_2$ to a first assignment of evaluation elements $14_1$ and $14_2$ in a first state and for connecting the same plurality of memory cells $12_1$ and $12_2$ to a second assignment of the evaluation elements $14_1$ and $14_2$ in a second state. That is, in the second state being illustrated, for example, in FIG. 1b, at least one memory cell $12_1$ and/or $12_2$ of the plurality of memory cells is connected to a different evaluation element (e.g., the different evaluation element is different from an evaluation element to which the at least one memory cell is connected in the first state). Although FIG. 1a and FIG. 1b show a switching or change between two assignments, embodiments are not limited hereto but allow for two or a higher number of assignments.

The memory device 10 comprises an evaluation unit 18 configured for controlling the interconnection unit 16 to transition from the first state of FIG. 1a to the second state of FIG. 1b. The evaluation unit 18 is configured for evaluating the plurality of memory cells $12_1$ and $12_2$ in the first state to obtain a first evaluation result, i.e., a read-out result, and for evaluating the plurality of memory cells in the second state to obtain a second evaluation result. That is, the evaluation unit 18 may read the same memory cells by using different assignments of evaluation elements 14.

FIG. 1b shows a schematic block diagram of the memory device 10 in the second state in which the assignment or connection provided by the interconnection unit 16 between memory cells $12_1$ and $12_2$ with regard to the evaluation elements $14_1$ and $14_2$ is changed. In the first state of FIG. 1a memory cell $12_1$ is evaluated by evaluation element $14_1$ and memory cell $12_2$ is evaluated by evaluation element $14_2$ as indicated by the solid lines. Similarly, the solid lines in FIG. 1b indicate that, in the second state, the memory cell $12_1$ is evaluated by evaluation element $14_2$ and memory cell $12_2$ is evaluated with evaluation element $14_1$. Such a changed assignment may change an order or sequence of content of memory cells $12_1$ and $12_2$ at the evaluation unit 18. However, as the evaluation unit 18 may control the interconnection unit 16, the evaluation unit 18 may consider this knowledge and may re-order the received bits so as to maintain or re-obtain a sequence of bits.

Examples are based on the idea of changing assignments between evaluation elements and memory cells. This may be performed in different ways, for example, a pair-wise change, a ring-based change, e.g., by connecting each evaluation element to the next memory cell along a specific direction, or a different solution.

That is, two comparable results may be obtained by evaluation unit 18 with regard to the same memory cells $12_1$ and $12_2$. This may allow for avoiding errors of memory cells that may occur when an imprecisely programmed or defined memory cell is read out by an imprecise evaluation unit. By changing the evaluation unit to be used with the memory cell, it is possible to avoid such an error as will be described later in more detail.

In the first state and in the second state, each of the plurality of memory cells may be connected to an evaluation element. It is possible but not necessary that each of the memory cells $12_1$ and $12_2$ is connected to a different evaluation unit. For example, evaluation unit 18 may have access to information that indicates that some of the memory cells and/or evaluation units may be considered as error-prone or weak such that errors that occur when reading those memory cells or by use of such an evaluation unit may be handled by reconnecting the respective memory cell or evaluation unit (so as to reconnect other elements, for example, or without reconnecting the other elements). Error-prone may be understood as being considered to have a higher error probability when compared to a reference state, e.g., in the first state than in the second state or vice versa.

The evaluation results being obtained in the first state and in the second state may each be a bit sequence, i.e., a first bit sequence in the first state and a second bit sequence in the second state. The evaluation unit 18 may be configured for assigning a value read from a memory cell to a same bit position in the first bit sequence and in the second bit sequence which may be referred to as inverse-re-ordering that counteracts the re-ordering from the first state to the second state. For example, the values of each of the memory cells may be assigned to same, unchanged bit positions. For example, when changing from the first state having an unchanged assignment and, in the example, allowing for evaluation of memory cell $12_1$ with evaluation element $14_1$ to the second state in which the same memory cell $12_1$ is evaluated by a different evaluation element $14_2$, the re-ordering may be adapted accordingly. This may allow the re-ordering to be used on both states or only in states in which a deviation from a reference state such as the first state is present in view of the assignment.

Figure 2B:
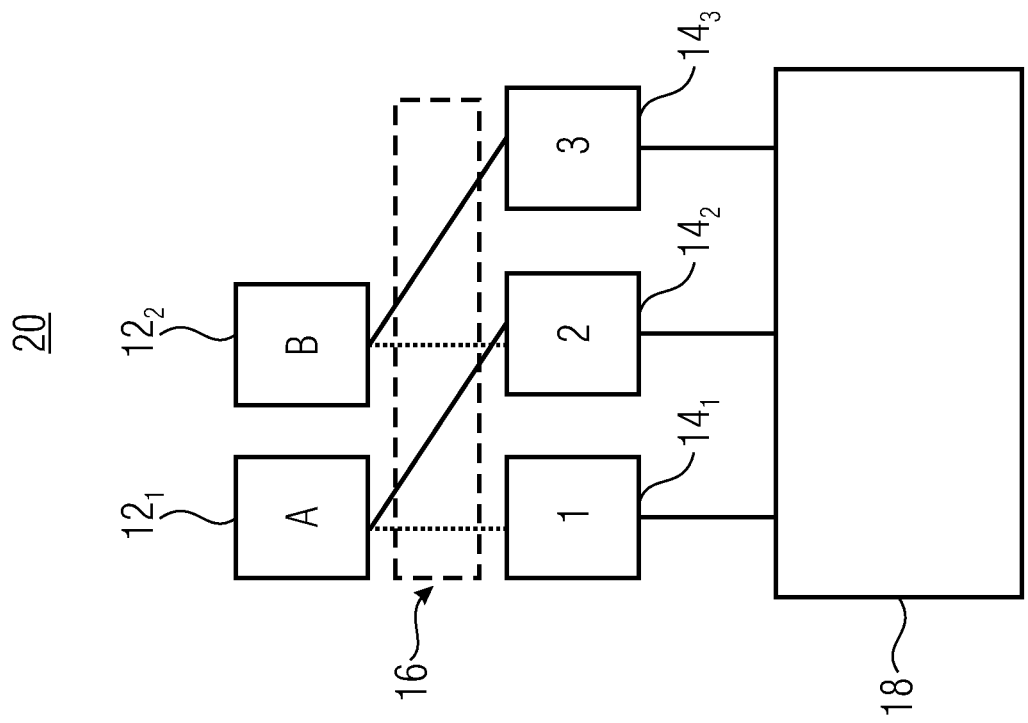
FIG. 2b shows a schematic block diagram of the memory device of FIG. 2a in a second state.
Figure 2A:
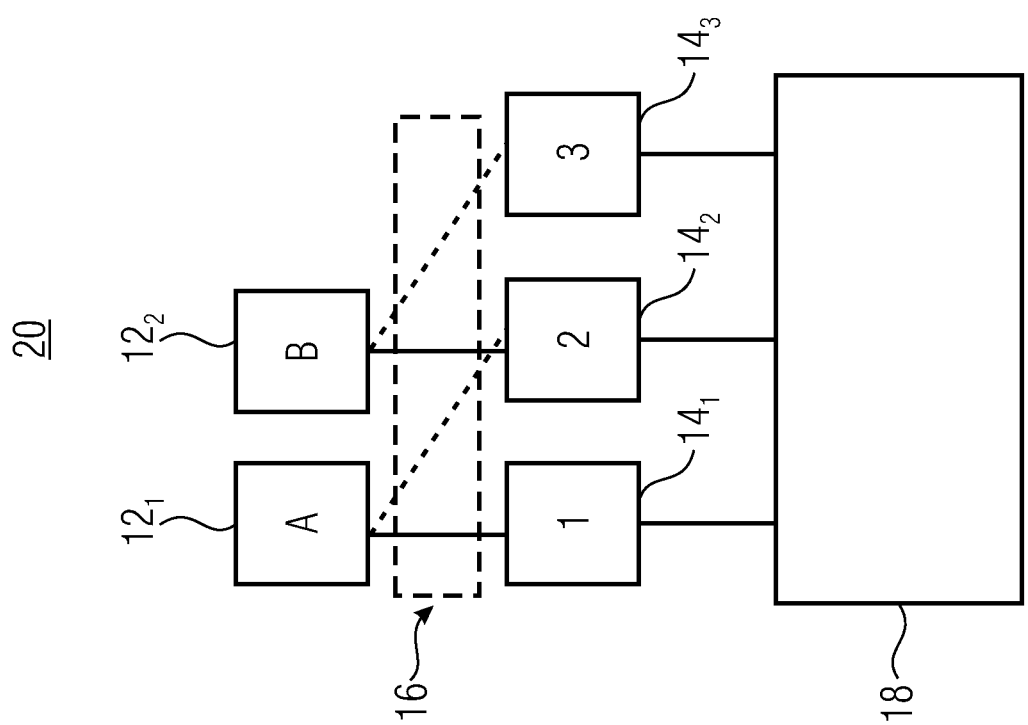
FIG. 2a shows a schematic block diagram of a memory device according to a further example and in a first state thereof.

FIG. 2a shows a schematic block diagram of a memory device 20 according to an example and in a first state thereof. FIG. 2b shows a schematic block diagram of the memory device 20 in a second state.

Compared to the memory device 10, the memory device 20 may be adapted so as to use at least one different evaluation element $14_3$ being unused in the first state. For example, the memory cell $12_1$ may be evaluated by use of evaluation element $14_1$ and memory cell $12_2$ may be evaluated by use of evaluation element $14_2$. In the second state, the memory element $12_1$ may be evaluated by use of the evaluation element $14_2$. In some examples, the evaluation element $14_1$ may be used for evaluating the memory cell $12_1$. For example, an evaluation element $14_3$ may be connected to the memory cell $12_2$ in the second state.

That is, at least one memory cell $12_1$ or $12_2$ is connected to a different evaluation element in the second state when compared to the first state. This different evaluation element may be unused in the first state or may be used for a different memory cell in the first state.

Figure 3:
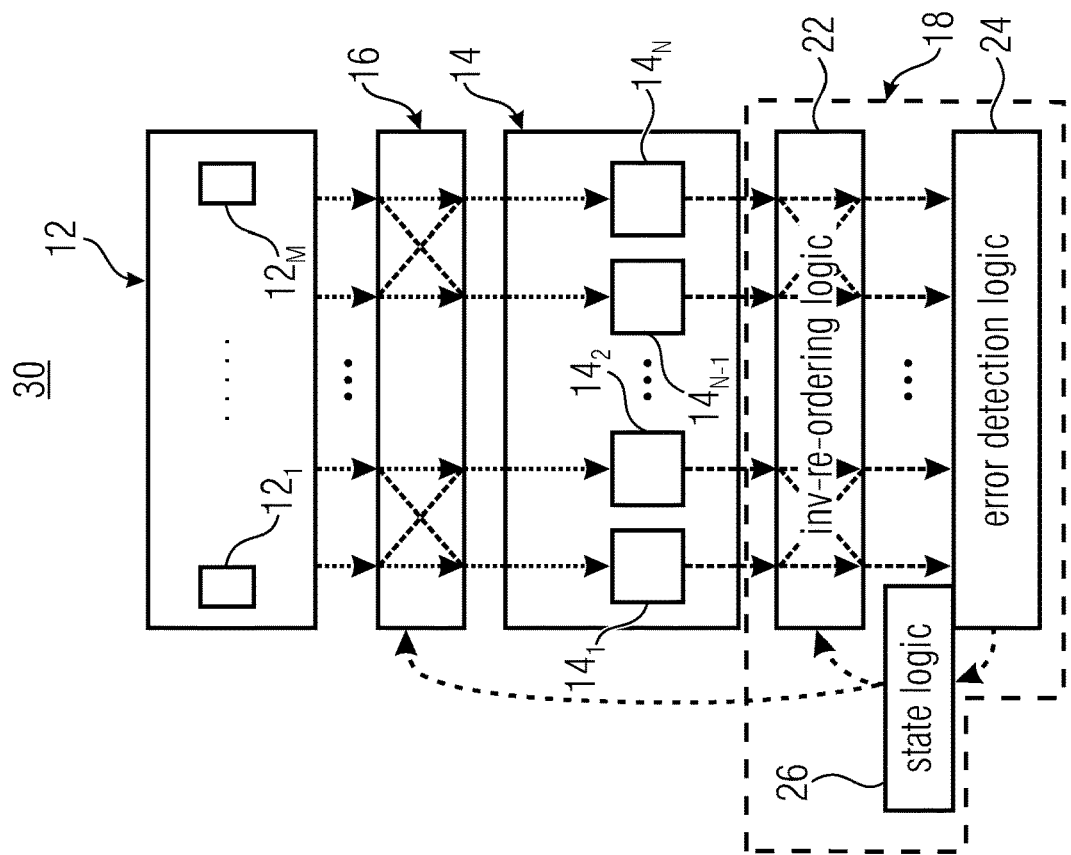
FIG. 3 shows a schematic block diagram of a memory device according to an example, having a re-ordering logic and an inverse re-ordering logic.

FIG. 3 shows a schematic block diagram of a memory device 30 according to an example. The memory device 30 comprises a plurality of memory cells $12_1$ to $12_M$ providing for a memory field or an arrangement 12 of memory cells.

The interconnection unit 16 may implement a re-ordering logic. The interconnection unit 16 may comprise a circuitry that receives a set of basically analog signals from the memory cells $12_1$ and $12_2$ so as to provide each of those values to different evaluation elements in different states of the memory device 30. The evaluation elements may convert the set of analog values to a set of basically digital values, i.e., a result of the evaluation elements $14_1$ to $14_N$. That is, according to an example, an evaluation element may comprise a sense amplifier or a different element for providing a digital value based on an analog value derived from the memory cell. An order or sequence of these output values may be controlled by the control signals generated by the evaluation unit 18.

The evaluation unit 22 may comprise or implement an inverse re-ordering logic 22. The inverse re-ordering logic 22 may be implemented at least partially in software and/or at least partially in hardware including a pure software implementation and a pure hardware implementation. The inverse re-ordering logic may re-sort the sequence of bits being read from the memory field 12 so as to revert the changed order being changed with the re-ordering logic of the interconnection unit 16. That is, the inverse re-ordering of the evaluation unit may be inverse to a re-ordering logic implemented by the interconnection unit 16 and may be configured for changing an assignment of the evaluation element to a bit position from the first state to the second state inversely to the re-ordering logic to keep a bit position of a single memory cell, a plurality of memory cells or of all memory cells in the first bit sequence and in the second bit sequence constant or unchanged. This may allow a same sequence of bits to be obtained from the memory cells being evaluated when changing the assignment of evaluation elements. The evaluation unit 18 may be configured for providing the first bit sequence and the second bit sequence with a same order or identical order of bits, i.e., the representation of values of memory cells in the bit sequences may remain unchanged.

The evaluation unit 18 may comprise an error detection unit 24 providing for examples according to which the evaluation unit is configured for determining bit errors of the received result. That is, the information about stored bits in the memory field 12 may be provided to the evaluation unit 18. For example, a use of error detecting codes or error correcting codes may allow detection of an occurrence of bit errors in the readout of the evaluated memory cells, i.e. in the sequence of bits. An error correcting code may comprise a capability to detect a certain first amount of bit errors and possibly to correct a certain, usually lower, second amount of bit errors. Embodiments are contemplated in which the certain second amount of bit errors is higher than or equal to the certain first amount of bit errors.

Memory devices according to examples may be configured for always reading the plurality of memory cells, i.e., the target data, using the first and second state. However, e.g., to save time and/or energy, devices may be implemented to perform a read operation in the second state on demand, e.g., when the error detection logic 24 determines that a number of bit errors in the first evaluation result, i.e., the first state, exceeds a number of errors according to a pre-defined threshold, e.g., a number of correctable errors. For example, the number of bit errors may exceed the number that are correctable but is within a number which is still detectable with the error detection unit 24 and by use of storing information in the memory cells employing an error correcting code.

The memory device 30 may comprise a control unit 26, for example, as part of the evaluation unit 18. The control unit 26 may implement a state logic and may receive a result with regard to the occurred errors from the error detection unit 24. The control unit 26 may further be connected to the interconnection unit 16 and the inverse re-ordering logic 22 so as to control the memory device 30 from the first state to the second state. When having set the memory device 30 to the second state, the memory cells may be re-read. For example, the evaluation unit 18 may be configured for determining that a second number of bit errors occurring in the second evaluation result at the second state is at most the number of errors being correctable, i.e., within the capability of the error correcting code. The evaluation unit 18 may be configured for using the second, correctable evaluation result as a result of a read-out operation of the memory device. In some examples, the evaluation unit 18 may be configured for using the second, correctable evaluation result to correct the bit errors.

In such a scenario, two read out operations are performed so as to provide for a final result, e.g., by use of the second evaluation result.

However, examples are not limited to such a scenario. According to an example, a memory device such as the memory device 10, 20 and/or 30 may be configured for performing at least a third read-out operation using a third assignment, of evaluation units and memory cells, that differs from the first assignment in the first state and the second assignment in the second state.

The evaluation unit may be configured for determining a combined evaluation result as a decision by majority, e.g., by comparing the first result and the second result for coincidence. According to examples, the evaluation unit 18 may control the memory device to at least a third assignment to obtain at least a third evaluation result of the plurality of memory cells in such a third state. Such a third (or higher number) of results may enhance obtaining the decision, e.g., allowing a 2:1-decision or the like within the decision by majority. Alternatively, such a decision by majority may be performed group-wise for groups of memory cells, each group of memory cells having at least one memory cell, thereby including a cell-individual decision. By obtaining three or more results with regard to a single memory cell, a group thereof or the set to be read, the evaluation result may implement different criteria for deciding on which result to rely and/or how to interpret those results.

However, examples are not limited to selecting either the first or the second (or a higher number or iteration) result or by performing a majority decision. For example, when having knowledge at the evaluation unit which evaluation element and/or which memory cell is possibly erroneous, an overall or combined result may also be obtained by combining different evaluation results of different readouts, e.g., by combining bit values being deemed to be error free or by excluding erroneous bits.

According to an example, an extension for n data reads, i.e., n states with different sense amplifier assignments may allow performance of a bit-wise majority decision on the n read results which may be derived, for example, subsequently. For undecided bits, which may occur for a number of n=2*k read operations, such bits may be marked as (erasure) for handling in suitable ECC (error correction code), i.e., the bit position may be marked for the ECC. Such information may be stored together with error information 32 and may indicate, for example, that a bit error is present at a specific bit position. Writing the error information 32 may, thus, allow for a learning system that may allow, for example, exclusion of error-prone combinations from read operations. Alternatively or in addition and being possible for every value of n, some and/or all unstable bits may be marked as erasures.

Alternatively or in addition, a memory device according to an example, e.g., memory device 10, 20 and/or 30, may be implemented to re-read the memory cells with different assignments of evaluation units until a result is obtained that comprises at most a number of correctable errors. That is, the evaluation unit may be configured for repeating a read-out operation using different assignments or evaluation elements of memory cells until a correctable read-out result is obtained or until a termination criteria occurs, e.g., a maximum count of read-out operations being pre-defined, a time out or a control command or the like.

In other words, the memory field provides basically analog values that represent data when read out. The evaluation elements, e.g., sense amplifiers, may comprise or represent any circuitry that accepts one or more basically analog values from a memory and converts them into one or more digital data bits. For example, one analog value is converted into one digital bit. This may allow for one bit of information to be provided per memory cell. However, one or more memory cells may be implemented as multi-level storage in which one analog value is converted into more than one digital bit. Alternatively or in addition, in some examples, a plurality of memory cells of the memory device 10, 20 and/or 30 may be implemented to form multi-cell storage in which more than one analog value is converted into one digital bit.

The error detection logic of the error detection unit 24 may be understood as a circuitry that by checking some properties of a set of data bits determines, if the data can be correct or not. This may be a simple parity checking logic that checks if the parity of a set of data bits has the expected value, i.e., if the number of 0s or 1s in the set is even or odd as expected. Alternatively or in addition, the error detection logic may be a logic that checks if a check sum, (e.g., CRC (cyclic redundancy check) sum) for the set of data bits has the expected value. Alternatively or in addition, the error detection logic may implement an EDC (error detection code) logic that checks the adherence of the set of data bits to a special code. Alternatively or in addition, this may be an ECC (error correction code) logic that checks and (if required and possible) corrects the set of data bits according to a special code, but also detects that a correction is not possible or sensible. Those examples include a combination of two or more of these possibilities. In case of a data inconsistency being generated by the evaluation unit 18, the error detection logic may initiate a re-read. The maximum number of re-reads may be limited to a pre-defined number. The error detection logic may be implemented in hardware and/or software.

The state logic or control unit 26 may also be implemented in hardware and/or software. It may implement a logic that consistently controls the re-ordering logic or interconnection unit 16 and the inverse re-ordering logic 22 so that overall their data re-ordering cancels out. At least two different orders exist or are implemented, i.e., there are at least two states the state logic can be in. According to examples, several different states exist, i.e., at least three, at least four, at least five, at least six or even more. The initial read-out operation for some data is performed either with a default initial state or just with the current state, i.e., the state being used at last. The state of the state logic, i.e., the employed re-ordering, is changed, for example, if the error detection logic detects a data inconsistency and a re-read as initiated. This state change may be deterministic (e.g., employing a counter or any other deterministic finite state machine) or by random.

The inverse re-ordering logic may also be implemented in hardware and/or software. It may comprise a circuitry or control element such as a processor, field programmable gate array (FPGA), microcontroller or the like that takes in a set of digital signals and outputs the received values on a set of digital signals, where the order of these output values is controlled by the control signals generated by the state logic. That is, the inverse re-ordering logic may re-sort the digital bits based on the order provided by the interconnection unit 16. The inverse re-ordering logic may undo the re-ordering imposed by the re-ordering logic, so that the overall data bits assignment may remain unchanged.

As described, some parts of the described logic, e.g., the state logic and the inverse re-ordering logic may be implemented at least partially in software.

Figure 4:
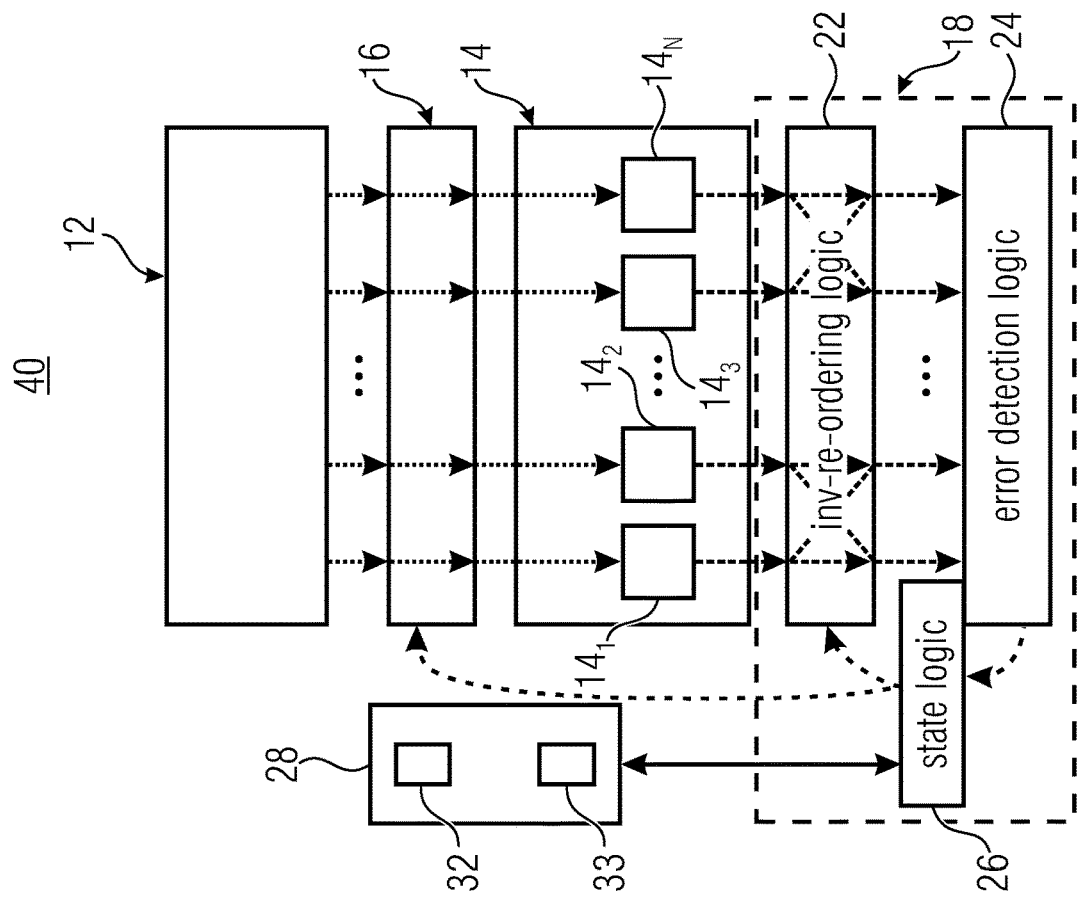
FIG. 4 shows a schematic block diagram of a memory device according to an example having a memory to read and/or write error information.

FIG. 4 shows a schematic block diagram of a memory device 40 according to an example. The memory device 40 may comprise at least in parts a same configuration and/or elements as memory device 30. The evaluation unit 18 of the memory device 40 may be configured for reading, from a memory 28 to which the evaluation unit 18 has access, error information indicating that a specific pair of a memory cell $12_i$ of the plurality of memory cells and an evaluation element $14_j$ is error-prone, i.e., likely to cause errors. The evaluation unit 18 may be configured to obtain the second evaluation result based on the first evaluation result being based on the specific pair indicated by the error information and/or may be configured to avoid the specific pair when evaluating the plurality of memory cells.

That is, when detecting that the evaluated bit sequence comprises errors and when the error information 32 indicates that for obtaining the evaluation result, an error-prone pair of memory cell and evaluation unit was used, the evaluation unit 18 may decide to perform a re-read.

This may be considered as a posteriori analysis while the obtained bit sequence is of low quality. According to an example, the evaluation unit may also be configured to evaluate the error information 32 a priori. For example, when the error information 32 indicates that the future read-out operation will use, e.g., in the present state, an error-prone combination of memory cell and evaluation unit, the evaluation unit 18 may decide to change the state. This may allow for obtaining a first result of a first read-out operation already in a different state and may thus allow avoidance of usage of the specific pair and thus may allow avoidance of a read-out operation which may be expected to result in errors.

The error information 32 may be stored in the memory 28, e.g., during manufacturing. Alternatively or in addition, the error information 32 may be generated or provided by the evaluation unit being configured for storing the error information 32. The error information 32 may refer, for example, to stuck bits or memory cells being stuck at a specific logical value, to error-prone bits or memory cells and/or to error-prone combinations of memory cells and evaluation units. For example, the evaluation unit 18 may evaluate the read-out operations while monitoring which cell has been evaluated with which evaluation unit and may derive the error information 32 based thereon.

Examples of the present disclosure allow for memory devices being configured for determining a result of a read-out operation of the plurality of memory cells without using an error correcting code, e.g., using a code that is capable of only detecting errors, i.e., an error detecting code such as a code using parity bits. For example, when judging a final result by a combination, e.g., in majority decision, of multiple read-out operations and/or by considering error information 32, it is possible to provide for memory devices that can perform read-out operations with an acceptable reliability whilst making a use of an error correcting code optional, which may allow for saving resources, computational complexity, memory cells, evaluation units or the like.

According to an example, using the error information indicating that a reading operation using a specific pair of a memory cell of the plurality of memory cells and an evaluation unit in the first state is error-prone to obtain an evaluation result of the plurality of memory cells based on a reading operation using the second state based on the error information, i.e., for example to avoid the reading in the first state, may be implemented as an alternative to obtain both results.

Figure 5B:
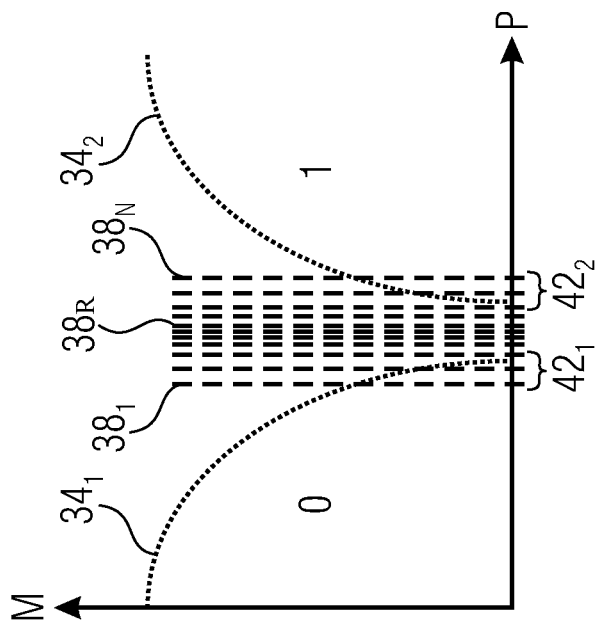
FIG. 5b shows a schematic representation of the distribution of FIG. 5a in a disturbed state.
Figure 5A:
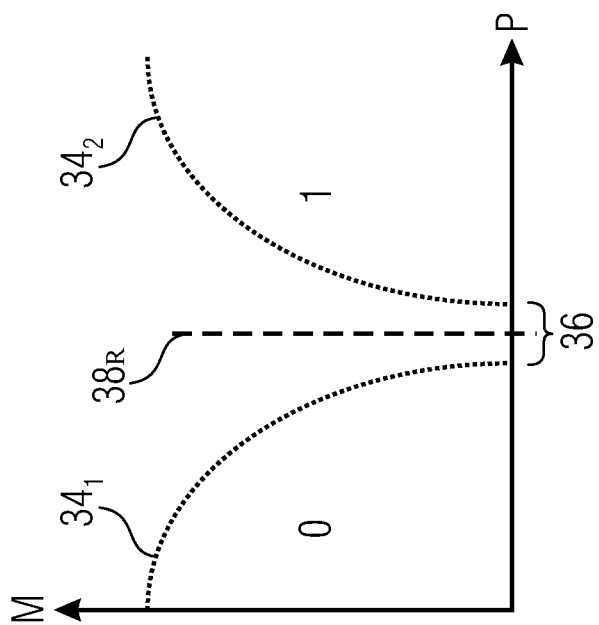
FIG. 5a shows a schematic representation of a possible distribution of an amount of memory cells at the ordinate of a graph whilst having a parameter to be sensed at the abscissa in an ideal state.

FIG. 5a shows a schematic representation of a possible distribution of an amount M of memory cells at the ordinate of a graph whilst having a parameter P to be sensed, for example, a current I, a voltage V or a resistance R at the abscissa. Whilst the number of cells is, by way of example, equal for cells being programmed to a logical 0 and for cells being programmed to a logical 1, a first distribution 34₁ and a second distribution 34₂ show a target design of a memory device according to which a maximum number of programmed cells is spaced apart within the specification of the device. However, due to imperfection in manufacturing of memory cells, some memory cells being programmed to one value, e.g., logical 0, comprise an analog value being higher than the typical value, wherein memory cells of distribution $34_2$ being programmed to the respective other value, e.g., logical 1, may comprise cells that comprise a comparatively low value of the analog parameter. Within the design of the memory device, a window 36 may be present between the distributions $34_1$ and $34_2$. The window 36 which may also be referred to as a gap may comprise a comparatively small width, e.g., at most 30%, at most 20% or at most 10% of a basis value of the memory cell, e.g., 30%, 20% or 10% of 30 μA.

For example, within the window 36, e.g., at a center thereof or a mean value thereof a discriminating threshold $38_R$ of an evaluation element 14 may be specified. That is, even if comprising a minimum value of the distribution $34_2$, a memory cell may be judged to be a programmed logical 1. Alternatively, even if comprising a maximum value within the distribution $34_1$, the cell may be judged to be programmed to a logical 0 by use of the discriminating threshold $38_R$.

FIG. 5b shows a schematic representation of the distribution of FIG. 5a being extended to a possible non-ideal behavior of a plurality of evaluation elements, e.g., the evaluation elements 14 of memory devices 10, 20 and/or 30. Those evaluation elements may comprise a distribution within their real discriminating thresholds which may lead to the effect that some of the discriminating thresholds being implemented by the memory device lie within the distribution $34_1$ or $34_2$ of programmed memory cells. For example, when considering a discriminating threshold $38_1$ being lower with regard to the parameter P and when compared to the ideal reference discriminating threshold $38_R$, memory cells of distribution $34_1$ comprising a higher value than the discriminating threshold $38_1$ may be interpreted faultily, e.g., within an error range $42_1$. Same is true for an error range $42_2$ which may be obtained by discriminating thresholds being higher when compared to the reference discriminating threshold $38_R$ such that memory cells being programmed to a logical 1 may be interpreted as a 0 when being evaluated by an evaluation element having a high or even too high discriminating threshold as illustrated for discriminating threshold $38_N$.

Memory cells within the error ranges $42_1$ and $42_2$ may form a so-called bad pair with an evaluation element that itself comprises a high deviation from a designed value. Such pairs may be avoided or changed by examples described herein.

In other words, when a non-volatile memory is read out, an analog property of a memory cell (e.g., its resistance) may be evaluated by a sense amplifier. The different cells of a memory array (intrinsically or due to, e.g., data retention issues) may have differing analog properties so that the properties of some and/or all cells combined form property distributions $34_1$ and $34_2$ as shown in FIG. 5a. A sense amplifier may determine if the analog property for a cell lies above or below a discriminating threshold 38 and accordingly may assign logical values, e.g., 0 and 1 as also shown in FIG. 5a. A set of actually realized sense amplifiers may display some random and chip-dependent variation in the exact values of the discriminating thresholds as shown in FIG. 5b. The actual values may, e.g., be normally distributed around the target discriminating threshold $38_R$. Since for some of the sense amplifiers the discriminating threshold may cut into the distribution $34_1$ or $34_2$, this may lead to read errors that would possibly not exist for ideal sense amplifiers.

These read errors may be detected using special codes for the stored data, e.g., error detecting codes and/or error correcting codes. Some codes may allow for detecting and correcting up to a certain number of incorrect bits in a set of data bits. But in case too many read errors occur simultaneously, a correction using the code may not be possible anymore, even though the errors are still detected as such. In case uncorrectable errors are detected, a re-try or re-read may be initiated, hoping that random fluctuations in the read process may lead to correct or at least correctable data in the obtained second state. In some examples, since the root cause for the read error is not tackled, such a solution may have a limited success rate.

The root cause of the read error may lie in the imperfect implementation of the sense amplifiers caused e.g. by fluctuations in production, i.e., in the differing discriminating thresholds at least in part. A sense amplifier with an especially strongly shifted threshold may not be able to read marginal cells providing an analog value of the parameter close to the read window correctly, e.g., sense amplifiers $14_1$ and $14_N$ being represented by thresholds $38_1$, $38_N$ respectively. It may be expected that only a small number of sense amplifiers coincide with a small number of marginal cells being involved in this error. This allows that examples rely in the principle that the re-ordering or re-assignment of the sense amplifiers provide a high probability that the read error is not present in the obtained second state. In case a read error was detected for some initial read data, initiating a re-read may help. With a new assignment of the sense amplifiers, at least some or even all of the sense amplifiers may be used to evaluate the properties of a different cell compared to the initial read. With a significant probability, the above described coincidents may be avoided and the data may be read correctly or at least correctable in the re-read. If necessary, re-reads (e.g., several re-reads) with different assignments of the sense amplifiers may be triggered until the data is read correctly. To implement such examples, some comparatively small logic may be used.

Figure 6B:
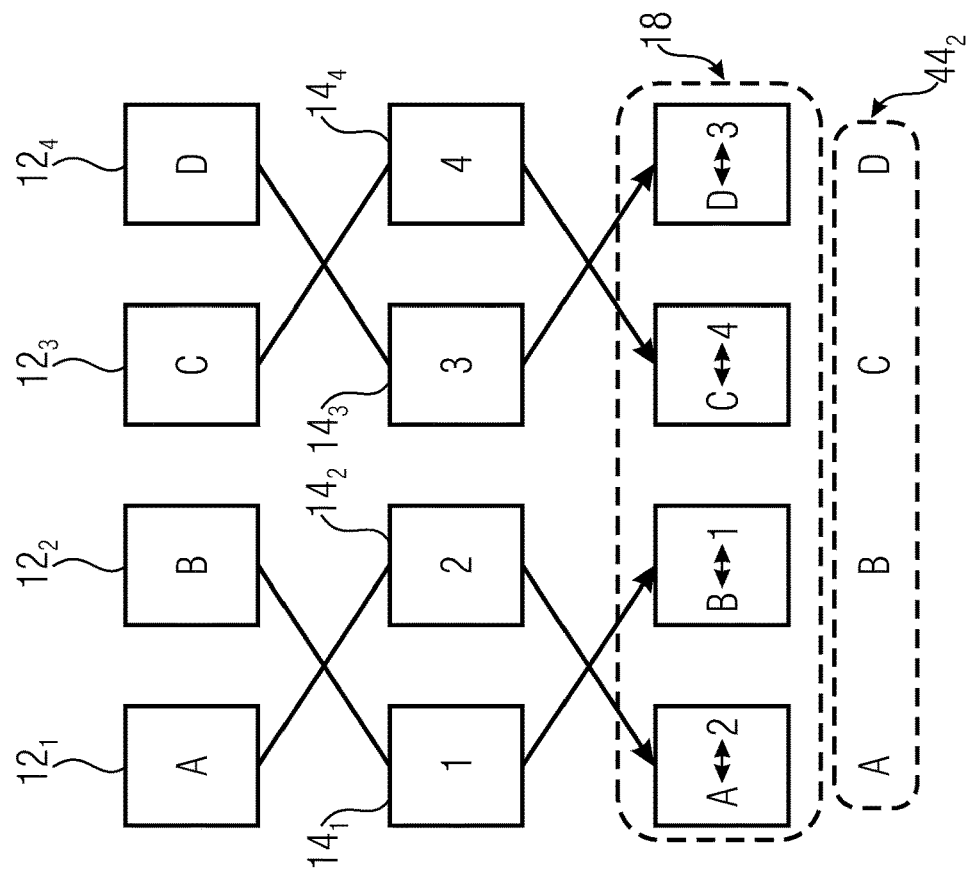
Figure 6A:
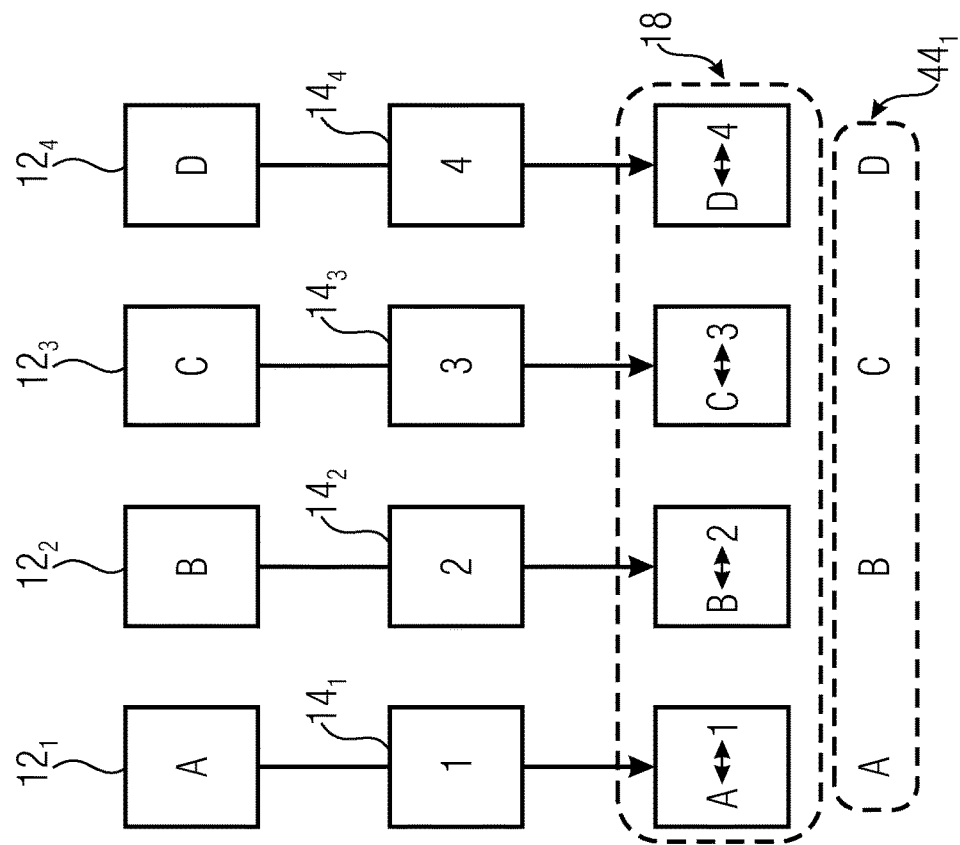
FIG. 6a shows a schematic block diagram for obtaining a first evaluation result in a first state of an example memory device.

FIG. 6a shows a schematic block diagram for obtaining a first evaluation result $44_1$, e.g., in a first state of a memory device 10, 20 and/or 30. For example, four memory cells $12_1, 12_2, 12_3$ and $12_4$ are evaluated by use of four evaluation elements $14_1, 14_2, 14_3$ and $14_4$. To enhance understanding of the example, memory cells $12_1$-$12_4$ have stored thereon information A, B, C and D, each letter being a part of a bit, a bit or a set of bits. As illustrated in connection with the evaluation unit 18, in the first state information A is evaluated with evaluation element $14_1$, the evaluation elements $14_1$-$14_4$ being numbered with Arabic numbers for the sake of a good understanding. That is, information A is evaluated by evaluation unit 1, information B with evaluation unit 2, information C with evaluation unit 3 and information D with evaluation unit 4. This may be interpreted, at the evaluation unit 18 as a sequence of information A, B, C and D.

FIG. 6b shows an example second state of the configuration of FIG. 6a in which the evaluation of memory cells $12_1$ and $12_2$ on the one hand and $12_3$ and $12_4$ on the other hand have been exchanged pair-wise. That is, information A is evaluated with evaluation element $14_2$ whilst information B is evaluated with evaluation element $14_1$. This change in the order or sequence of information may be retrieved by use of the evaluation unit 18, e.g., the inverse re-ordering logic so as to re-sort the retrieved information to arrive still at a sequence A, B, C and D in the second state $44_2$. However, if a pair $12_1/14_1$, $12_2/14_2$, $12_3/14_3$ and/or $12_4/14_4$ is erroneous, there is a chance that the evaluation result $44_2$ in the second state does not comprise such an error, errors at different locations and/or a lower amount of errors. Examples apply, without any limitation, in an opposite direction, i.e., when changing from the illustrated second state of FIG. 6b to the first state of FIG. 6a. Examples further allow for changing the connection between a memory cell and an evaluation element different from a pair-wise exchange, e.g., a ring-based change, e.g., by connecting each evaluation element to the next memory cell along a specific direction, adding and/or removing an evaluation unit from the assignment or differently.

Figure 7:
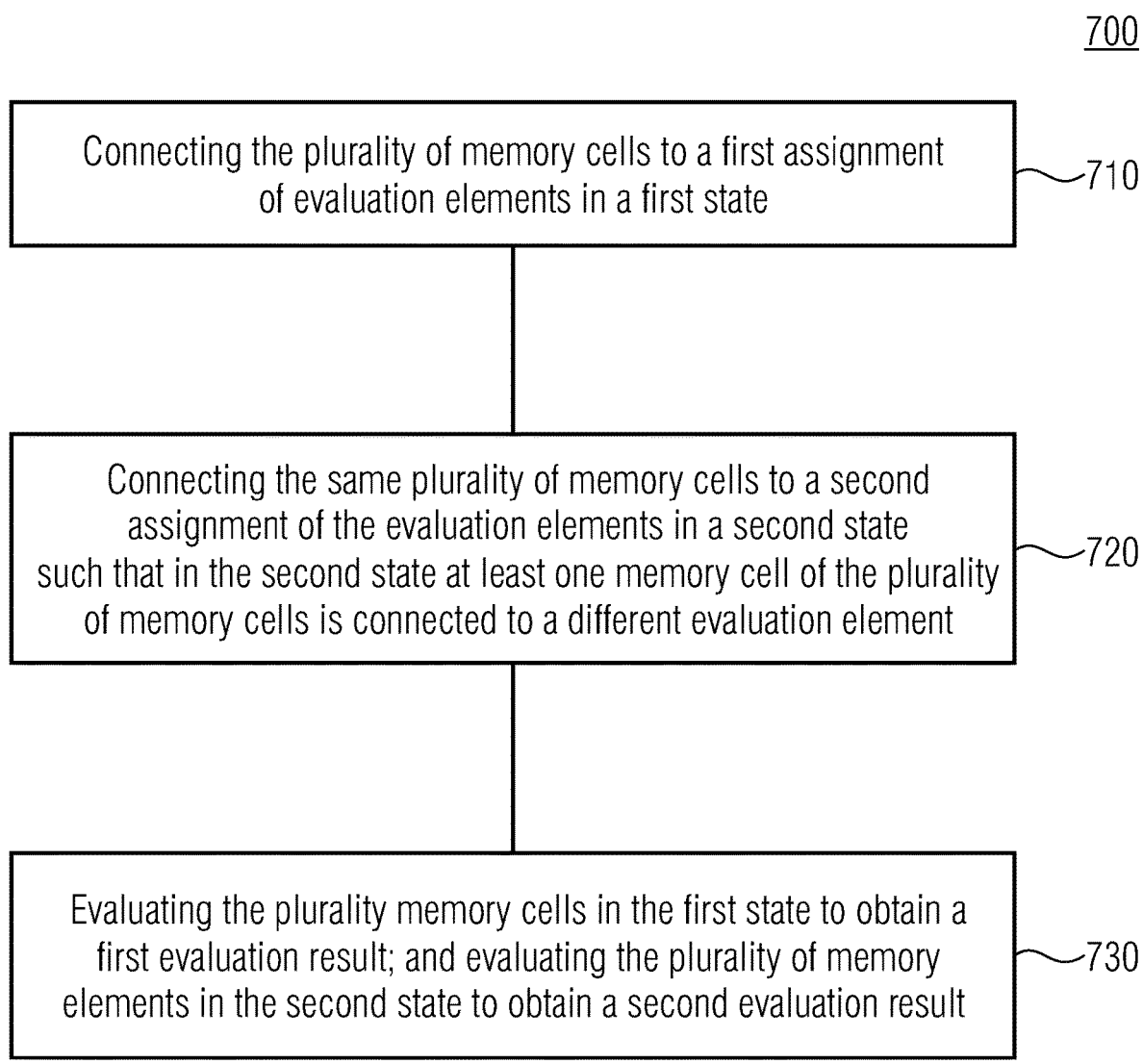
FIG. 7 shows a schematic flow chart of a method according to an example.

FIG. 7 shows a schematic flow chart of a method 700 according to an example. Method 700 may be used, for example, to operate device 10, 20 and/or 30. In 710, the plurality of memory cells is connected to a first assignment of evaluation elements in a first state. In 720, the same plurality of memory cells is connected to a second assignment of the evaluation elements and in a second state, such that in the second state at least one memory cell of the plurality of memory cells is connected to a different evaluation element (e.g., the different evaluation element is different from an evaluation element to which the at least one memory cell is connected in the first state). In 730, the plurality of memory cells is evaluated in the first state to obtain a first evaluation result and, in the second state, the plurality of memory elements is evaluated in the second state to obtain a second evaluation result. 730 may be split and, for example, be partly executed in connection with 710 leading to the first state and partly together with 720 leading to the second state.

Figure 8:
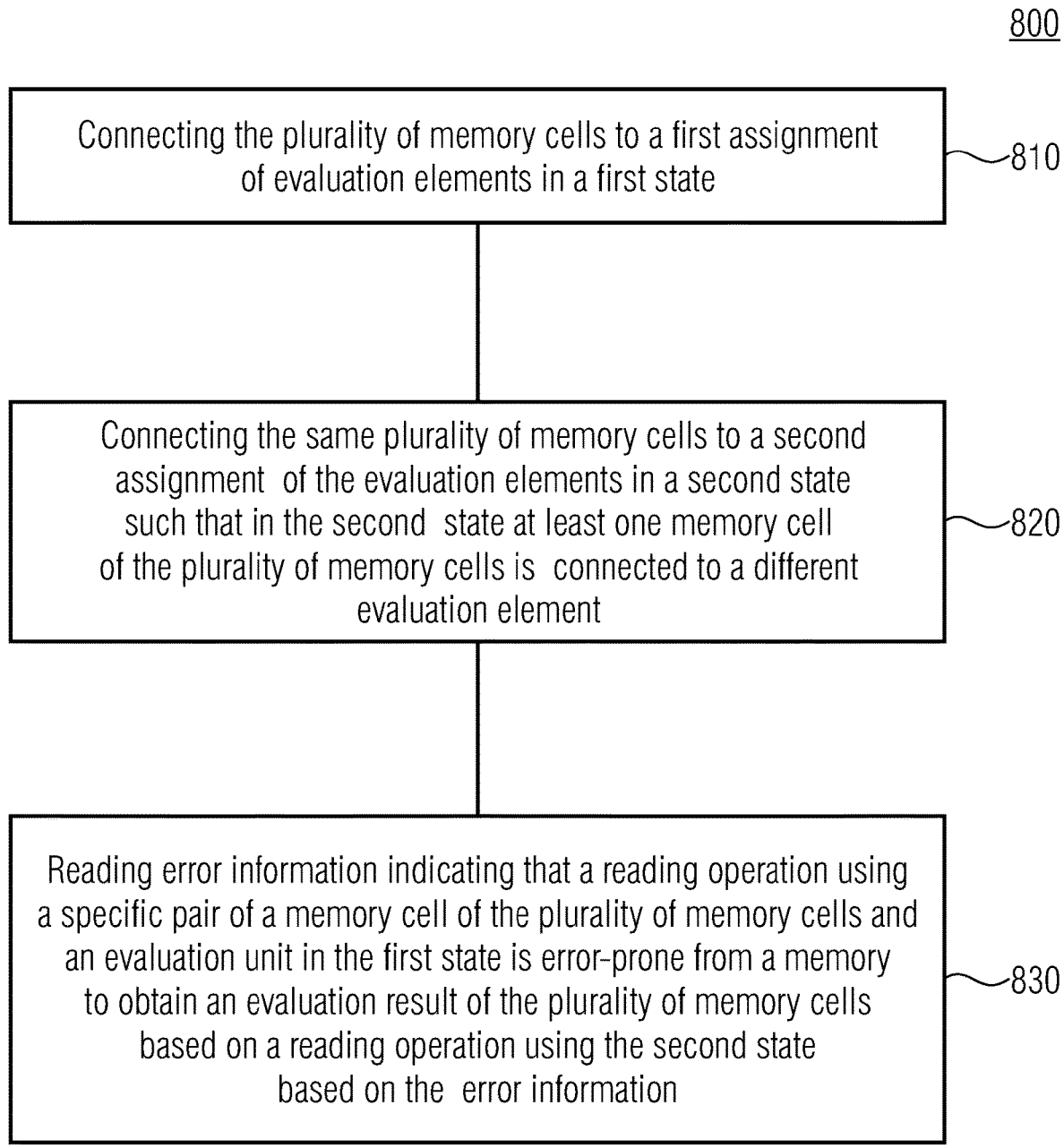
FIG. 8 shows a schematic flow chart of a method according to a further example.

FIG. 8 shows a schematic flow chart of a method 800 according to an example which may be used, for example, for operating memory device 10, 20 and/or 30. In 810, the plurality of memory cells is connected to a first assignment of evaluation elements and in a first state. 810 may correspond to 710. In 820, the same plurality of memory cells may, as described in connection with 720, be connected to a second assignment of the evaluation elements and in a second state, such that in the second state at least one memory cell of the plurality of memory cells is connected to a different evaluation element (e.g., the different evaluation element is different from an evaluation element to which the at least one memory cell is connected in the first state). In 830, error information is read from a memory, the error information indicating that a reading operation using a specific pair of a memory cell of the plurality of memory cells and an evaluation unit in the first state is error-prone. An evaluation result of the plurality of memory cells is based on a reading operation using the second state based on the error information (e.g., the reading operation may be performed using the second state based on the error information).

Examples are based on a re-ordering or re-assignment of evaluation elements or sense amplifiers, in case a read error was detected for some data. A following re-read of the same data may be performed with a different assignment of the sense amplifiers to the data bits, which may improve the probability to read correct or at least correctable data or data with a lower amount of errors.

Instead or in addition, to improve the reliability of a memory, the area of the sense amplifiers may be reduced, accepting a resulting lower precision of the discriminating threshold which can be compensated by the described re-read scheme. That is, at least a part of the avoidable errors may be invested into a lower precision of the evaluation elements. Alternatively or in addition, the power consumption of the sense amplifiers may be reduced, again accepting a resulting lower precision of the discriminating thresholds which can also be compensated by the described re-read scheme.

According to an example, an application of examples described herein is testing and characterizing sense amplifiers. A whole distribution of a set of cells may be read with sense amplifiers (e.g., several sense amplifiers), revealing directly their different thresholds. This may become useful or even important, when the sense amplifiers are already used during programming for shaping the distributions. In such cases, the absolute cell distribution may be modulated by and/or normalized to the sense amplifiers variations, with an influence on, e.g., programming stress or retention. The sense amplifier variation may then be detectable by reading the same cells with different sense amplifiers as it is provided by examples described herein.

Examples described herein relate to using deviations between evaluation units so as to avoid or reduce read errors. However, the finding of the present disclosure is not limited hereto. Examples relate further for determining a deviation which is described, for example, in connection with FIG. 5b between the evaluation units in a meaning of compensating the same.

Figure 9:
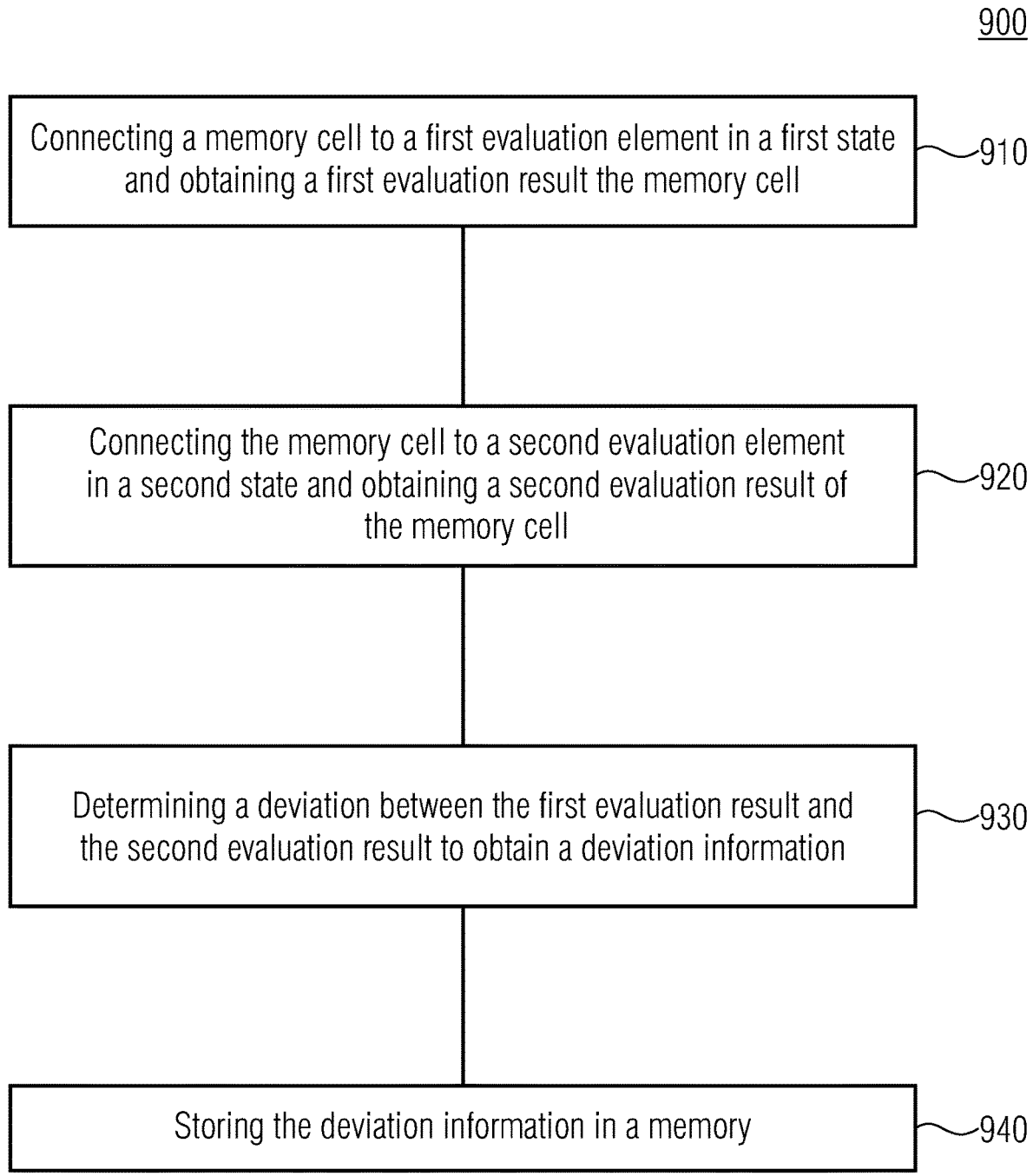
FIG. 9 shows a schematic flow chart of a method according to an example to derive deviation information.

FIG. 9 shows a schematic flow chart of an example method 900 according to an example. In 910, a memory cell is connected to a first evaluation element in a first state and a first evaluation result of the memory cell is obtained, e.g., by reading the memory cell. For example, the first evaluation result of the memory cell is obtained using the first evaluation element (e.g., the first evaluation result may be obtained using the first evaluation element when the memory cell is connected to the first evaluation element in the first state). In 920, the same memory cell is connected to a second, different evaluation element in a second state. A second evaluation result of the memory cell is obtained, e.g., by performing a re-read. For example, the second evaluation result of the memory cell is obtained using the second evaluation element (e.g., the second evaluation result may be obtained using the second evaluation element when the memory cell is connected to the second evaluation element in the second state). In 930, a deviation between the first evaluation result and the second evaluation result is determined to obtain a deviation information (e.g., the deviation information is determined based on the deviation). The deviation information may relate to the digital information and/or may, for example, relate to a deviation between the read-out result of the analog value. For example, different analog values may be used for the determination of the deviation information, the different analog values being obtained in the first state and in the second state. In 940, the deviation information may be stored in a memory. The deviation information may be stored, for example, as deviation information 33 in memory 28 being illustrated, for example, in FIG. 4. This deviation information may provide for a kind of correction value which may be considered when performing further operations.

A memory device in accordance with examples, e.g., memory device 10, 20, 30 and/or 40 may have stored or otherwise access to a deviation information, e.g., deviation information 33. The deviation information may indicate a deviation between a behavior of evaluation units, e.g., a value causing an offset with regard to a reference value such as the threshold $38_R$. The memory device, e.g., the evaluation unit may be configured for correcting the first evaluation result and/or the second evaluation result using the deviation information, e.g., by applying it as a correction value and/or correction factor.

Method 900 may be performed, for example, by the memory device itself but also by some kind of calibration device. For example, the method 900 may be performed by the memory device and/or a calibration device. A memory device in accordance with examples thus comprises at least one memory cell, e.g., a reference cell and a plurality of evaluation elements, each evaluation element connectable with the memory cell of the memory device. The memory device comprises an interconnection unit configured for connecting the memory cell to a first evaluation element in a first state and for connecting the memory cell to a second evaluation element in a second state. The memory device further comprises an evaluation unit configured for obtaining a first evaluation result of the memory cell in the first state and for obtaining a second evaluation result of the memory cell in a second state. The evaluation unit is configured for determining a deviation between the first evaluation result and the second evaluation result and for storing a deviation information in a memory of the memory device (e.g., the deviation information is based upon the deviation). For example and when referring to memory devices 10, 20, 30 and/or 40, a reference memory field may be connected to the interconnection unit 16, which may be also part of the test device. The evaluation elements 14 may, however, be a part of a later memory device to be calibrated. According to an example, the memory device 10, 20, 30 and/or 40 may use its own memory cells, i.e., the memory field 12 for internal determination. For example, each evaluation unit that is adapted to be connected to a specific memory cell in later operation, e.g., using the different states, may be evaluated or considered in view of the deviation information, the respective information to be stored in a memory such as the memory 28. That is, a memory device in accordance with examples may comprise an evaluation unit being configured for determining a deviation information for a same memory cell based on different evaluation results being obtained with different evaluation elements 14 and/or may be configured for reading such a deviation information from a memory, the deviation information indicating a deviation between a behavior of evaluation units so as to allow correction of the first evaluation result and/or the second evaluation result using the deviation information.

Although being described in connection with a single memory cell, method 900 may be performed for a plurality of memory cells in parallel. Method 900 may be used for characterizing, for example, at least a part or even all memory cells of a memory field or at least a part or all evaluation elements.

It is to be noted that actions of methods 700, 800 and 900 may be combined with each other in any manner, i.e. that method 800 and/or 900 may be performed, at least in parts, together with method 700 or vice versa and/or that method 900 may be performed, at least in parts together with method 800 or vice versa.

Although some aspects have been described in the context of an apparatus, it is clear that these aspects also represent a description of the corresponding method, where a block or device corresponds to a method act or a feature of a method act. Analogously, aspects described in the context of a method act also represent a description of a corresponding block or item or feature of a corresponding apparatus.

Depending on certain implementation requirements, examples of the present disclosure can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some examples according to the present disclosure comprise a data carrier having electronically readable control signals, which are capable of cooperating with a programmable computer system, such that one of the methods described herein is performed.

Generally, examples of the present disclosure can be implemented as a computer program product with a program code, the program code being operative for performing one of the methods when the computer program product runs on a computer. The program code may for example be stored on a machine readable carrier.

Other examples comprise the computer program for performing one of the methods described herein, stored on a machine readable carrier.

In other words, an example of an example method is, therefore, a computer program having a program code for performing one of the methods described herein, when the computer program runs on a computer.

A further example of an example methods is, therefore, a data carrier (or a digital storage medium, or a computer-readable medium) comprising, recorded thereon, the computer program for performing one of the methods described herein.

A further example of an example method is, therefore, a data stream or a sequence of signals representing the computer program for performing one of the methods described herein. The data stream or the sequence of signals may for example be configured to be transferred via a data communication connection, for example via the Internet.

A further example comprises a processing means, for example a computer, or a programmable logic device, configured to or adapted to perform one of the methods described herein.

A further example comprises a computer having installed thereon the computer program for performing one of the methods described herein.

In some examples, a programmable logic device (for example a field programmable gate array) may be used to perform some or all of the functionalities of the methods described herein. In some examples, a field programmable gate array may cooperate with a microprocessor in order to perform one of the methods described herein. Generally, the methods are preferably performed by any hardware apparatus.

The above described examples are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

The invention claimed is:

1. A memory device comprising:
a plurality of memory cells;
a plurality of evaluation elements, wherein each evaluation element of the plurality of evaluation elements is connectable with a memory cell of the memory device and is configured to evaluate a physical parameter, of the memory cell, comprising at least one of a voltage at the memory cell, a potential at the memory cell, a current through the memory cell or an electrical resistance of the memory cell;
an interconnection unit configured for:
at a first time, connecting the plurality of memory cells to a first assignment of evaluation elements in a first state; and
at a second time, connecting the plurality of memory cells to at least a second assignment of the evaluation elements in a second state, wherein in the second state, at least one memory cell of the plurality of memory cells is connected to a different evaluation element to which the at least one memory cell is not connected in the first state; and
an evaluation unit configured for:
controlling the interconnection unit to transition from (i) the first state in which the at least one memory cell is not connected to the different evaluation element to (ii) the second state in which the at least one memory cell is connected to the different evaluation element;
evaluating the plurality of memory cells in the first state, using the evaluation elements connected to the plurality of memory cells in accordance with the first assignment, to obtain a first evaluation result based on one or more first evaluations of one or more physical parameters of the plurality of memory cells; and
evaluating the plurality of memory cells in the second state, using the evaluation elements connected to the plurality of memory cells in accordance with the second assignment, to obtain a second evaluation result based on one or more second evaluations of one or more physical parameters of the plurality of memory cells.

2. The memory device of claim 1, wherein in the first state and in the second state, each memory cell of the plurality of memory cells is connected to an evaluation element.

3. The memory device of claim 1, wherein:
the first evaluation result represents a first bit sequence;
the second evaluation result represents a second bit sequence; and
the evaluation unit is configured for providing the first bit sequence and the second bit sequence with a same order of bits.

4. The memory device of claim 3, wherein:
the interconnection unit comprises a re-ordering logic to implement the first assignment and the second assignment; and
the evaluation unit comprises an inverse re-ordering logic that is inverse to the re-ordering logic, wherein the inverse re-ordering logic is configured for changing an assignment of an evaluation element to a bit position from the first state to the second state inversely to the re-ordering logic to keep a bit position of a value read from a memory cell in the first bit sequence and in the second bit sequence unchanged.

5. The memory device of claim 1, wherein the evaluation unit is configured for:
determining that a first number of bit errors in the first evaluation result exceeds a number of errors being correctable with an error correcting code being used for storing information in the plurality of memory cells;
determining that a second number of bit errors in the second evaluation result is at most the number of errors being correctable with the error correcting code; and using the second evaluation result as a result of a read-out operation of the memory device.

6. The memory device of claim 1, wherein the memory device is configured for determining a result of a read-out operation of the plurality of memory cells using an error detection code.

7. The memory device of claim 1, wherein the evaluation unit is configured for:
   determining that a first number of bit errors in the first evaluation result exceeds a predefined threshold; and
   controlling the interconnection unit to transition to the second state based on the first number of bit errors.

8. The memory device of claim 1, wherein the evaluation unit is configured for at least one of:
   obtaining at least a third evaluation result of the plurality of memory cells using a third assignment of evaluation elements to the plurality of memory cells in a third state; or
   determining a combined evaluation result as a decision by:
      majority common for the plurality of memory cells; or
      group-wise for groups of memory cells, wherein each group of memory cells of the groups of memory cells have at least one memory cell.

9. The memory device of claim 1, wherein the evaluation unit is configured for repeating a read-out operation using different assignments of evaluation elements to memory cells until:
   a correct or correctable read-out result is obtained; or
   a termination criterion occurs.

10. The memory device of claim 1, wherein the evaluation unit is configured for storing error information indicating that a pair of a memory cell and an evaluation element is error-prone in a memory accessible for the memory device.

11. The memory device of claim 1, wherein the evaluation unit is configured for:
    reading, from a memory, error information indicating that a pair of a memory cell of the plurality of memory cells and an evaluation element is error-prone; and
    at least one of:
      obtaining the second evaluation result based on the first evaluation result being based on the pair; or
      avoiding the pair when evaluating the plurality of memory cells.

12. The memory device of claim 1, wherein at least one evaluation element of the plurality of evaluation elements comprises a sense amplifier.

13. The memory device of claim 1, wherein the plurality of memory cells is at least one of:
    implemented to provide for one bit of information per memory cell;
    implemented as multi-level storage; or
    implemented as multi-cell storage.

14. The memory device of claim 1, wherein the evaluation unit is configured for:
    determining a deviation between at least an evaluation result of a first evaluation element in a first evaluation and an evaluation result of a second evaluation element in a second evaluation, wherein the first evaluation element and the second evaluation element are used for a same memory cell;
    determining a deviation information indicating the deviation between evaluation results of the same memory cell; and
    storing the deviation information in a memory of the memory device.

15. The memory device of claim 1, wherein the memory device is configured for:
    reading a deviation information from a memory, wherein the deviation information indicates a deviation between behaviors of evaluation elements; and
    correcting the first evaluation result or the second evaluation result using the deviation information.

16. A memory device comprising:
    a plurality of memory cells;
    a plurality of evaluation elements, wherein each evaluation element of the plurality of evaluation elements is connectable with a memory cell of the memory device and is configured to evaluate a physical parameter, of the memory cell, comprising at least one of a voltage at the memory cell, a potential at the memory cell, a current through the memory cell or an electrical resistance of the memory cell;
    an interconnection unit configured for:
       at a first time, connecting the plurality of memory cells to a first assignment of evaluation elements in a first state; and
       at a second time, connecting the plurality of memory cells to a second assignment of the evaluation elements in a second state, wherein in the second state, at least one memory cell of the plurality of memory cells is connected to a different evaluation element to which the at least one memory cell is not connected in the first state;
    an evaluation unit configured for controlling the interconnection unit to transition from (i) the first state in which the at least one memory cell is not connected to the different evaluation element to (ii) the second state in which the at least one memory cell is connected to the different evaluation element; and
    a memory having stored thereon error information indicating that a reading operation using a pair of a memory cell of the plurality of memory cells and an evaluation element in the first state is error-prone, wherein the evaluation unit is configured for:
       reading the error information from the memory; and
       obtaining, using the evaluation elements connected to the plurality of memory cells in accordance with the second assignment, an evaluation result of the plurality of memory cells based on a reading operation performed using the second state based on the error information.

17. A memory device comprising:
    a memory cell;
    a plurality of evaluation elements, wherein each evaluation element of the plurality of evaluation elements is connectable with the memory cell of the memory device and is configured to evaluate a physical parameter, of the memory cell, comprising at least one of a voltage at the memory cell, a potential at the memory cell, a current through the memory cell or an electrical resistance of the memory cell;
    an interconnection unit configured for:
       at a first time, connecting the memory cell to a first evaluation element but not a second evaluation element in a first state; and
       at a second time, connecting the memory cell to the second evaluation element but not the first evaluation element in a second state; and
    an evaluation unit configured for:

obtaining a first evaluation result of the memory cell in the first state based on one or more first evaluations of one or more physical parameters of the memory cell;

obtaining a second evaluation result of the memory cell in the second state based on one or more second evaluations of one or more physical parameters of the memory cell;

determining a deviation between the first evaluation result and the second evaluation result; and storing a deviation information, that is based on the deviation, in a memory of the memory device.

18. A method for operating a memory device comprising a plurality of memory cells and a plurality of evaluation elements, wherein each evaluation element of the plurality of evaluation elements is connectable with a memory cell of the memory device and is configured to evaluate a physical parameter, of the memory cell, comprising at least one of a voltage at the memory cell, a potential at the memory cell, a current through the memory cell or an electrical resistance of the memory cell, the method comprising:

connecting the plurality of memory cells to a first assignment of evaluation elements in a first state;

connecting the plurality of memory cells to a second assignment of the evaluation elements in a second state, wherein, in the second state, at least one memory cell of the plurality of memory cells is connected to a different evaluation element to which the at least one memory cell is not connected in the first state;

evaluating the plurality of memory cells in the first state in which the at least one memory cell is not connected to the different evaluation element, using the evaluation elements connected to the plurality of memory cells in accordance with the first assignment, to obtain a first evaluation result based on one or more first evaluations of one or more physical parameters of the plurality of memory cells; and evaluating the plurality of memory cells in the second state in which the at least one memory cell is connected to the different evaluation element, using the evaluation elements connected to the plurality of memory cells in accordance with the second assignment, to obtain a second evaluation result based on one or more second evaluations of one or more physical parameters of the plurality of memory cells.

19. A computer readable digital storage medium having stored thereon a computer program having a program code for performing, when running on a computer, a method according to claim 18.

20. A method for operating a memory device comprising a plurality of memory cells and a plurality of evaluation elements, wherein each evaluation element of the plurality of evaluation elements is connectable with a memory cell of the memory device and is configured to evaluate a physical parameter, of the memory cell, comprising at least one of a voltage at the memory cell, a potential at the memory cell, a current through the memory cell or an electrical resistance of the memory cell, the method comprising:

connecting the plurality of memory cells to a first assignment of evaluation elements in a first state;

connecting the plurality of memory cells to a second assignment of the evaluation elements in a second state, wherein, in the second state, at least one memory cell of the plurality of memory cells is connected to a different evaluation element to which the at least one memory cell is not connected in the first state; and reading error information, indicating that a reading operation using a pair of a memory cell of the plurality of memory cells and an evaluation element in the first state, in which the at least one memory cell is not connected to the different evaluation element, is error-prone, from a memory to obtain, using the evaluation elements connected to the plurality of memory cells in accordance with the second assignment, an evaluation result of the plurality of memory cells based on a reading operation performed using the second state, in which the at least one memory cell is connected to the different evaluation element, based on the error information.

21. A method for operating a memory device comprising a memory cell and a plurality of evaluation elements, wherein each evaluation element of the plurality of evaluation elements is connectable with the memory cell of the memory device and is configured to evaluate a physical parameter, of the memory cell, comprising at least one of a voltage at the memory cell, a potential at the memory cell, a current through the memory cell or an electrical resistance of the memory cell, the method comprising:

connecting the memory cell to a first evaluation element but not a second evaluation element in a first state;

obtaining, based on one or more first evaluations of one or more physical parameters of the memory cell, a first evaluation result, of the memory cell, using the first evaluation element;

connecting the memory cell to the second evaluation element in a second state but not the first evaluation element;

obtaining, based on one or more second evaluations of one or more physical parameters of the memory cell, a second evaluation result, of the memory cell, using the second evaluation element;

determining a deviation between the first evaluation result and the second evaluation result to obtain a deviation information; and storing the deviation information in a memory.

* * * * *